(12) United States Patent
Egg et al.

(10) Patent No.: US 8,938,483 B1
(45) Date of Patent: Jan. 20, 2015

(54) FILTER PARALLELIZATION FOR HIGH DATA THROUGHPUT

(75) Inventors: Benjamin Egg, Fallbrook, CA (US); Frederic J. Harris, Lemon Grove, CA (US); Christopher H. Dick, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 612 days.

(21) Appl. No.: 13/186,868

(22) Filed: Jul. 20, 2011

(51) Int. Cl.
   *G06F 17/10* (2006.01)
(52) U.S. Cl.
   USPC .......................................................... 708/319
(58) Field of Classification Search
   USPC ................................................ 708/316, 319
   See application file for complete search history.

(56) References Cited

U.S. PATENT DOCUMENTS

| | | | | |
|---|---|---|---|---|
| 4,821,223 A | * | 4/1989 | David ........................... | 708/308 |
| 5,103,416 A | * | 4/1992 | Cavallotti et al. ............. | 708/319 |
| 5,262,972 A | * | 11/1993 | Holden et al. ................. | 708/316 |
| 5,642,382 A | * | 6/1997 | Juan .............................. | 375/232 |

* cited by examiner

*Primary Examiner* — Chuong D Ngo
(74) *Attorney, Agent, or Firm* — Kevin T. Cuenot

(57) ABSTRACT

A filter can include a first channel and a second channel. The first channel can be configured to process a first term and a second term of an input vector using a first coefficient and a second coefficient of the filter. The first channel can be configured to generate a first term of an output vector. The second channel can be configured to process the first term and the second term of the input vector using the first coefficient and the second coefficient of the filter. The second channel can be configured to generate a second term of the output vector. The first and second channels can be configured to operate in parallel.

8 Claims, 3 Drawing Sheets

FILTER PARALLELIZATION FOR HIGH DATA THROUGHPUT

FIELD OF THE INVENTION

One or more embodiments disclosed within this specification relate to data processing using filters. More particularly, one or more embodiments relate to parallelizing a filter to achieve high data throughput.

BACKGROUND

Sample rates for analog-to-digital converters (ADCs) and for digital-to-analog converters (DACs) continue to increase. Increasing sample rates, in turn, drive requirements for signal conversion components used within the data path of such converters, whether for purposes of analog-to-digital conversion or for digital-to-analog conversion. For example, referring to both ADCs and DACs, high end converters have emerged that are capable of operating in the range of approximately four giga-samples per second. Converters operating in the giga-sample range have been used in various technologies including, but not limited to, spectrum sensing equipment as used in cognitive radios and in advanced "full-spectrum" cable modem Edge Quadrature Amplitude Modulation (QAM) and Cable Modem Termination System (CMTS) equipment.

Signal processing circuits that process data from ADCs or that prepare data for output to DACs can have clock signals in the range of approximately hundreds of megahertz. This means that the difference in frequency between the clock signal used to drive the signal processing circuitry and the clock signal corresponding to circuitry processing the analog signals (e.g., ADCs and/or DACs) can be an entire order of magnitude or more.

SUMMARY

One or more embodiments disclosed within this specification relate to data processing using filters. More particularly, one or more embodiments relate to parallelizing a filter to achieve high data throughput.

An embodiment can include a method of processing a data stream using a filter. The method can include generating first product and a second product by multiplying each of a first term and a second term of an input vector respectively by a first coefficient of the filter using a first multiplier and delaying the first product and the second product to generate a delayed first product and a delayed second product. The method further can include delaying each of the first term and the second term to generate a delayed first term and a delayed second term and generating a third product and a fourth product by multiplying each of the delayed first term and the delayed second term respectively by a second coefficient of the filter using a second multiplier. The method also can include generating an output vector including a first term by summing the third product with the delayed first product and a second term by summing the fourth product with the delayed second product.

Another embodiment can include a filter. The filter can include a first processing channel configured to process a first term of an input vector within a first stage using a first coefficient of the filter and process a second term of the input vector in a second stage using a second coefficient of the filter. The first processing channel can be configured to generate a first term of an output vector. The filter further can include a second processing channel configured to process the second term of the input vector within a first stage using the first coefficient of the filter and process the first term of the input vector in a second stage using the second coefficient of the filter. The second processing channel can be configured to generate a second term of the output vector.

Another embodiment can include a filter. The filter can include a first processing channel configured to process a first term and a second term of an input vector using a first coefficient and a second coefficient of the filter. The first processing channel can be configured to generate a first term of an output vector. The filter further can include a second processing channel configured to process the first term and the second term of the input vector using the first coefficient and the second coefficient of the filter. The second processing channel can be configured to generate a second term of the output vector. The first channel and the second channel can be operable in parallel.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to data processing using a filter and, more particularly, to parallelizing a filter to achieve high data throughput. Parallelization of the filter can support high sample rates for data streams. For example, parallelization of a filter as described within this specification can achieve sample rates in the gigahertz range while allowing the various channels of the parallelized filter to function at frequencies or data rates below that of the data stream being processed.

Figure 1:
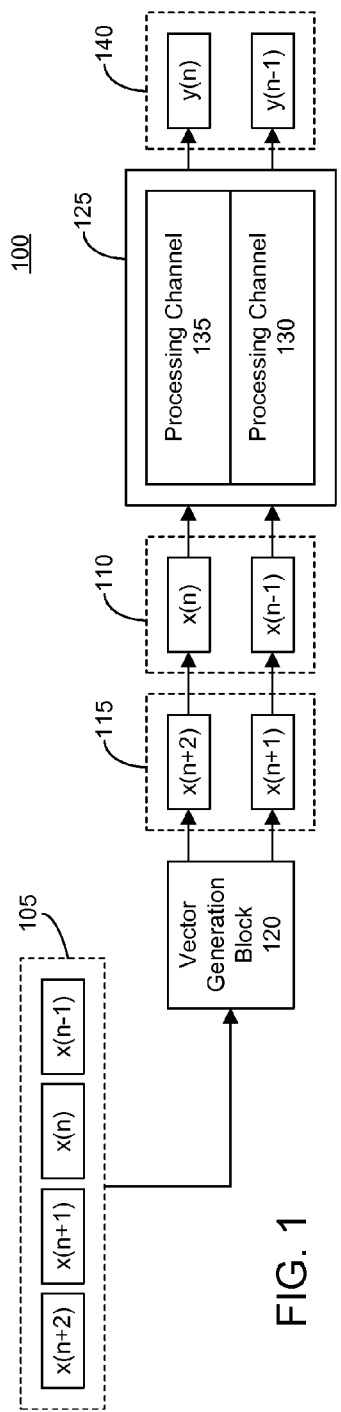
FIG. 1 is a first block diagram illustrating a system configured as a two-tap filter for processing a data stream in accordance with an embodiment disclosed within this specification.

FIG. 1 is a first block diagram illustrating a system 100 configured as a two-tap filter for processing a data stream in accordance with an embodiment disclosed within this specification. As shown, system 100 can include a vector generation block 120 and a filter 125. Filter 125 can include two or more processing channels 130 and 135. In general, filter 125 can be configured for parallel operation. In this regard, processing channels 130 and 135 can be configured to operate in parallel.

In an embodiment, filter 125 can be implemented as a type of Finite Impulse Response (FIR) filter. A conventional FIR type of filter can be characterized, at least in part, as a tap delay line that stores a history of input samples. Each input sample can be multiplied by a coefficient of the filter to produce an output. The output of the FIR filter is the sum of these products. An alternate implementation of a conventional FIR type of filter generates products as the input samples enter the filter. The sum of these products can be stored rather than the input samples. This alternate implementation of the FIR type filter is sometimes called a "partial sum accumulator." In any case, conventional FIR filters receive a single input and generate a single output. In this regard, conventional FIR filters are not multi-ported.

Referring to FIG. 1, each of the plurality of processing channels 130 and 135 can be configured to include one or more taps which will be described in greater detail with reference to the remaining figures. Further, each of processing channels 130 and 135 includes an input port and an output port. Accordingly, filter 125 can be characterized as having a multi-port input and a multi-port output.

As shown, a data stream 105 can be provided to vector generation block 120. Data stream 105 can include a plurality of samples, e.g., four samples, arranged as a serial data stream. In the example shown in FIG. 1, the variable "x" of each sample represents the value of the sample. The variable "n" of each sample represents a particular instance in time. Accordingly, a time series of samples can be represented as shown, where each has a value of "x" at a time specified by the expression involving "n" in parenthesis.

Vector generation block 120 can receive a serial data stream such as data stream 105 and can convert data stream 105 into one or more vectors that can be output and provided to filter 125 as input vectors. In the example shown in FIG. 1, vector generation block 120 can transform data stream 105 into a plurality of vectors, e.g., vectors 110 and 115. In general, the number of terms within each of vectors 110 and 115, as generated by vector generation block 120, will coincide with, or match, the number of parallel channels within filter 125.

Thus, in the example pictured in FIG. 1, each of vectors 110 and 115 includes two terms corresponding to processing channels 130 and 135. Vector generation block 120 can form vectors by taking samples from data stream 105 in the order received and organizing the samples into groupings of "M" samples. Each group of "M" samples can form an input vector. In this illustration, "M" equals the number of processing channels of filter 125. Each sample in a group of "M" samples corresponds to one of the aforementioned "terms" of the input vector that is formed.

As noted, filter 125 can receive a sequence of input vectors, e.g., input vectors 110 and/or 115, as input. Filter 125 can generate an output vector 140 as output. Output vector 140 can include a same number of terms as the received input vector, e.g., two terms in this example. Each of processing channels 130 and 135 can be configured to output one term of output vector 140. As shown, processing channel 130 can output a first term of output vector 140 denoted as "y(n−1)." Processing channel 135 can output a second term of output vector 140 denoted as "y(n)." Referring to output vector 140, the variable "y" can refer to the value that is output at a particular instance in time. As noted with respect to the input vectors, a particular instance in time can be denoted by "n," with the particular instance in time for each term of output vector 140 being denoted as a function of "n."

In an embodiment, the particular number of processing channels used by filter 125 can be determined, at least in part, according to a maximum frequency at which components within each respective one of processing channels 130 and/or 135 is capable of operating. For example, consider the case in which multipliers are utilized within each of processing channels 130 and 135. The multipliers, or other components of each processing channel, can be limited in terms of maximum operating frequency. For purposes of illustration, the multipliers can be the component within each of processing channels 130 and 135 that operates at the lowest frequency. In that case, the frequency of data stream 105 can be divided by the operating frequency, e.g., the maximum operating frequency, of the multipliers. The integer divisor determined can specify the number of processing channels to be used within filter 125 and, thus, the number of terms within each input vector received and each output vector generated.

Consider the case in which data stream 105 is output from an analog-to-digital converter (ADC) at a frequency, or a sample rate, of approximately 1 GHz. By using multiple, parallel processing channels, e.g., processing channels 130 and 135, the operational frequency of each processing channel can be less than that of serial data stream 105. More particularly, the width of the input vector, as measured in number of terms, can be determined according to the relationship of the sample rate of data stream 105 divided by the operational frequency of the multipliers of processing channels 130 and 135. Multipliers within each processing channel can be presumed to operate at substantially a same frequency or rate. Thus, referring to the example illustrated in FIG. 1, the multipliers within processing channels 130 and 135 can be limited to operating at approximately 500 MHz. Dividing the sample rate of data stream 105, e.g., 1 GHz, by 500 MHz, yields a width of two terms for input vectors 110 and 115 and, thus, two terms for output vector 140.

Whereas a conventional FIR filter typically has a single input port and a single output port, the embodiment illustrated in FIG. 1 includes multi-port input and a multi-port output. A single port FIR filter must complete the sum of products in a time interval shorter than the time interval between the arrival of successive input samples. The one or more embodiments disclosed within this specification can address the situation in which the time interval required to perform the multiply-accumulate operations through a single signal path is longer that the input sample-to-sample interval in that one or more simultaneous, or parallel, processing paths can be invoked to service the next input sample. Delayed versions of the input samples being processed in the first path can be shared with the processing performed in the second path. The one or more embodiments disclosed within this specification can store both products and input samples. In this regard, filter 125, for example, utilizes aspects of each of the tapped delay line and the partial sum accumulator types of filter implementations. Accordingly, whereas a conventional FIR filter can process a received scalar value as an input and generate a scalar value as an output, filter 125 can process a received input vector and generate an output vector. Thus, filter 125 can operate at a processing rate (e.g., a system clock rate or operational frequency of approximately 500 MHz) that is lower than the sample rate (e.g., 1000 MHz) of the input data stream, e.g., data stream 105, being processed.

Figure 2:
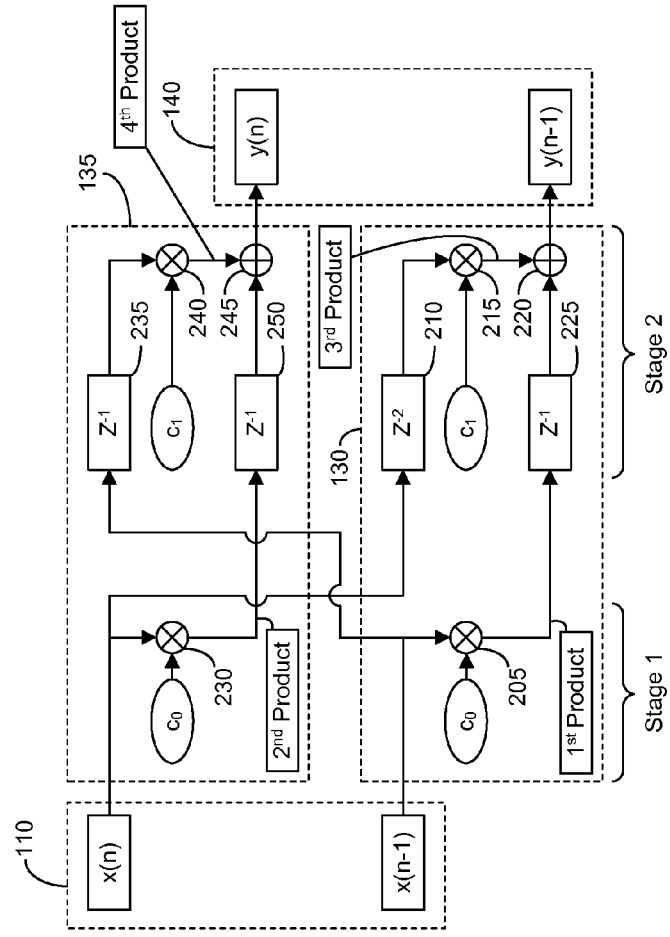
FIG. 2 is a second block diagram illustrating the processing performed by the processing channels of the filter of FIG. 1 in accordance with another embodiment disclosed within this specification.

FIG. 2 is a second block diagram illustrating the processing performed by the processing channels of filter 125 of FIG. 1 in accordance with another embodiment disclosed within this specification. As noted, filter 125 can be characterized, at least in part, by a multi-port input and a multi-port output. Each of processing channels 130 and 135 can be configured to include a single port capable of receiving at least one term of an input vector. Further each of processing channels 130 and 135 can be configured to function as a filter and generate one term of an output vector. Like numbers will be used to refer to the same items throughout this specification to the extent necessary.

Processing channel 130 can include multipliers 205 and 215, an adder 220, and delays 210 and 225. Delays 210 and 225 are illustrated as discrete time delays and, for purposes of illustration, are denoted as $z^{-1}$ operators using the Z-transform notation. Similarly, processing channel 135 can include multipliers 230 and 240, an adder 245, and delays 235 and 250. Delays 235 and 240 are also illustrated as $z^{-1}$ operators using the Z-transform notation.

For purposes of discussion, each of processing channels 130 and 135 can be organized or divided into a plurality of different stages. Each stage, in general, corresponds to a coefficient of filter 125. In this example, filter 125 includes two coefficients corresponding to two stages indicated in FIG. 2 as "stage 1" and "stage 2." As filter 125 includes two coefficients, filter 125 can be referred to as a first order filter. In general, the number of stages in each processing channel can be correlated with, or match, the number of coefficients of the filter.

Stage 1 of each of processing channels 130 and 135 can be characterized by a single multiplier. Within stage 1 of processing channel 130, the first term of vector 110, e.g., term "x(n−1)," is multiplied, using multiplier 205, by coefficient $c_0$ of filter 125. A product of the multiplication of "x(n−1)" with coefficient $c_0$, referred to as the first product, i.e., $[x(n-1)c_0]$, can be provided to stage 2 of processing channel 130. The first product can be provided to delay 225.

Similarly, within stage 1 of processing channel 135, the second term of vector 110, e.g., term "x(n)," is multiplied, using multiplier 230, by coefficient $c_0$ of filter 125. A product of the multiplication of x(n) with coefficient $c_0$, referred to as the second product, i.e., $[x(n)c_0]$, can be provided to stage 2 of processing channel 135 and, in particular, to delay 250.

Stage 2 of each of processing channels 130 and 135 can be characterized by the inclusion of a top delay, e.g., delay 210 of processing channel 130 and delay 235 of processing channel 135, and a bottom delay, e.g., delay 225 of processing channel 130 and delay 250 of processing channel 135. As shown, while the bottom delay in stage 2 processes the product received from the prior stage of the same processing channel, the top delay receives and processes a quantity that is received from a different communication channel.

Delay 225 of stage 2 of processing channel 130 can delay the first product to generate what can be referred to as a "delayed first product." As shown, stage 2 of processing channel 130 also receives the second term of vector 110 into delay 210. Delay 210 generates a delayed version of the second term referred to as the "delayed second term." The delayed second term is multiplied by coefficient $c_1$ using multiplier 215 to generate a third product. The third product is summed, using adder 220, with the delayed first product to generate the first term "y(n−1)" of output vector 140.

Delay 250 of stage 2 of processing channel 135 can delay the second product to generate what can be referred to as a "delayed second product." As shown, stage 2 of processing channel 135 also receives the first term of input vector 110 into delay 235. Delay 235 generates a delayed version of the first term referred to as the "delayed first term." The delayed first term is multiplied by coefficient $c_1$ using multiplier 240 to generate a fourth product. The fourth product is summed, using adder 245, with the delayed second product to generate the second term "y(n)" of output vector 140.

FIG. 2 illustrates a particular arrangement in the way coefficients of filter 125 can be applied to the vectorized input, e.g., input vector 110, that facilitates scaling in terms of width, e.g., number of terms of the input vector, and/or number of stages corresponding to the number of coefficients of filter 125. Connectivity among multipliers and adders is modified to facilitate parallelism and scalability. Filter 125 illustrates an example of a filter, e.g., an FIR filter, that can be used to process data streams received from a high-speed ADC or to process data streams that can be provided to a high speed DAC, e.g., after the vectorized output is serialized.

The embodiment illustrated in FIG. 2 illustrates one technique for parallelizing a filter into "M" processing channels configured to operate in parallel. Each processing channel, for example, can function as an individual filter that operates at approximately 1/M of the sample rate of the original serial data stream. The embodiment of FIG. 2 further is characterized in that the input rate to filter 125 is equal to the output rate from filter 125. More particularly, the input rate of input vectors is equal to the output rate of output vectors.

Another aspect of the embodiment pictured in FIG. 2 is that the speed requirement for the multiply-accumulate processing cycles is reduced by allocation of additional multiply-accumulate resources that operate simultaneously in the parallel path. The workload for computing each processing path is constant and is performed by reduced speed multipliers in the parallel paths.

The output vector generated by filter 100 is pictured as "y(n−1), y(n)." For purposes of illustration, the two terms of the output vector can be calculated as shown below. Note the downward flow delay element 210 contains the previous value of the input sample x(n−2) while the upward flow delay element 235 contains the delayed value of its current input sample $$y(n) = [x(n) \cdot c_0]Z^{-1} + [x(n-1)Z^{-1} \cdot c_1]$$
$$= [x(n) \cdot c_0 + x(n-1) \cdot c_1]Z^{-1}$$

$$y(n-1) = [x(n-1) \cdot c_0]Z^{-1} + [x(n-2)Z^{-1} \cdot c_1]$$
$$= [x(n-1) \cdot c_0 + x(n-2) \cdot c_1]Z^{-1}$$

Figure 3:
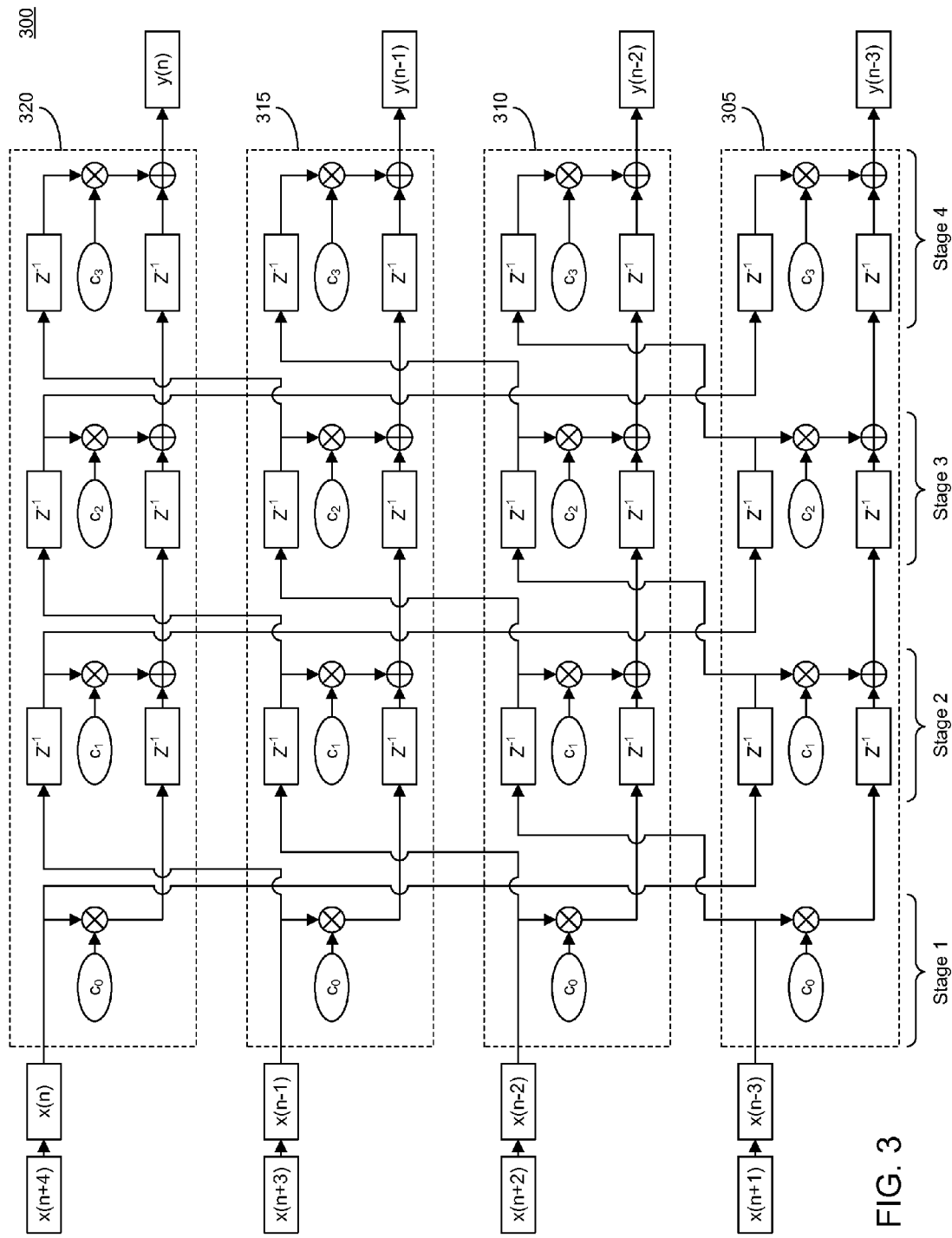
FIG. 3 is a third block diagram illustrating the processing performed by processing channels of a four-tap filter in accordance with another embodiment disclosed within this specification.

FIG. 3 is a third block diagram illustrating the processing performed by processing channels of a four-tap filter (filter) 300 in accordance with another embodiment disclosed within this specification. Filter 300 illustrates an example of the scalability of the filter architecture described with reference to FIG. 2. Filter 300 is an example of a third order filter, e.g., an FIR filter, having four coefficients.

Referring to FIG. 3, filter 300 implements a four-tap filter. For purposes of discussion, consider the case in which filter 300 operates on a 1 GHz data stream that has been converted into a series of four term vectors illustrated as a first vector including "x(n−3), x(n−2), x(n−1), x(n)" and a second vector including "x(n+1), x(n+2), x(n+3), x(n+4)." As noted with reference to FIG. 2, each processing channel of filter 300 can be configured as a filter. In an embodiment, each of processing channels 305, 310, 315, and 320 can be configured to operate as a four tap filter operating at a frequency of approximately 250 MHz, which corresponds to the frequency of 1 GHz divided by M, which is four in this example. This presumes that the multipliers within each of processing channels 305, 310, 315, and 320 are capable of operating at speeds of approximately 250 MHz.

Stages 1 and 2 of each of processing channels 305-320 can be configured substantially as described with reference to stages 1 and 2, respectively, of the processing channels of filter 125 of FIG. 2. Stages 3 and 4 can be configured substantially as described with reference to stage 2 of the processing channels of filter 125 of FIG. 2.

Accordingly, each of stages 2-4 can be characterized by the inclusion of a top delay and a bottom delay, e.g., two delays. The bottom delay within each of stages 2-4 of processing channels 305-320 can delay, or operate upon, data within the same processing channel. In illustration, the bottom delay of stage 2 of processing channel 305 processes data received from stage 1 of processing channel 305. The bottom delay of stage 3 of processing channel 305 processes data received from stage 2 of processing channel 305. The bottom delay of stage 4 of processing channel 305 processes data received from stage 3 of processing channel 305. The last stage of each respective channel generates one term of the output vector.

The top delay within each of stages 2-4 of each of processing channels 305-320 receives data, e.g., an input, from a different processing channel. For example, the top delay of stage 2 of processing channel 305 receives data from stage 1 of processing channel 320. The top delay of stage 2 of processing channel 310 receives data from stage 1 of processing channel 305. The top delay of stage 2 of processing channel 315 receives data from stage 1 of processing channel 310. Similarly, the top delay of stage 2 of processing channel 320 receives data from stage 1 of processing channel 315. Subsequent stages can be configured in the same or similar manner as pictured in FIG. 3.

The output vector generated by filter 300 is pictured as "y(n−3), y(n−2), y(n−1), y(n)." For purposes of illustration, the four terms of the output vector can be calculated as shown below. Note that the downward flow delay elements, the 3-upper delays in 305, contain the previous values x(n−4), x(n−5) and x(n−6), of the input samples, while the upward flow delays, the two upper right hand delays in 310 and the one upper right delay in 315, contain the delayed values of its current input sample.

$$y(n) = [x(n) \cdot c_0]Z^{-3} + [x(n-1)Z^{-1} \cdot c_1]Z^{-2} + [x(n-2)Z^{-2}c_2]Z^{-1} +$$

$$[x(n-3)Z^{-3}c_3]$$

$$= [x(n) \cdot c_0 + x(n-1) \cdot c_1 + x(n-2) \cdot c_2 + x(n-3) \cdot c_3]Z^{-3}$$

$$y(n-1) = [x(n-1) \cdot c_0]Z^{-3} + [x(n-2)Z^{-1} \cdot c_1]Z^{-2} + [x(n-3)Z^{-2} \cdot c_2]Z^{-1} +$$

$$[x(n-4)Z^{-3}c_3]$$

$$= [x(n-1) \cdot c_0 + x(n-2) \cdot c_1 + x(n-3) \cdot c_2 + x(n-4) \cdot c_3]Z^{-3}$$

$$y(n-2) = [x(n-2) \cdot c_0]Z^{-3} + [x(n-3)Z^{-1} \cdot c_1]Z^{-2} + [x(n-4)Z^{-2} \cdot c_2]Z^{-1} +$$

-continued $$[x(n-5)Z^{-3}c_3]$$

$$= [x(n-2) \cdot c_0 + x(n-3) \cdot c_1 + x(n-4) \cdot c_2 + x(n-5) \cdot c_3]Z^{-3}$$

$$y(n-3) = [x(n-3) \cdot c_0]Z^{-3} + [x(n-4)Z^{-1} \cdot c_1]Z^{-2} + [x(n-5)Z^{-1} \cdot c_2]Z^{-1} +$$

$$[x(n-6) \cdot c_3]$$

$$= [x(n-3) \cdot c_0 + x(n-4) \cdot c_1 + x(n-5) \cdot c_2 + x(n-6) \cdot c_3]Z^{-3}$$

Figure 4:
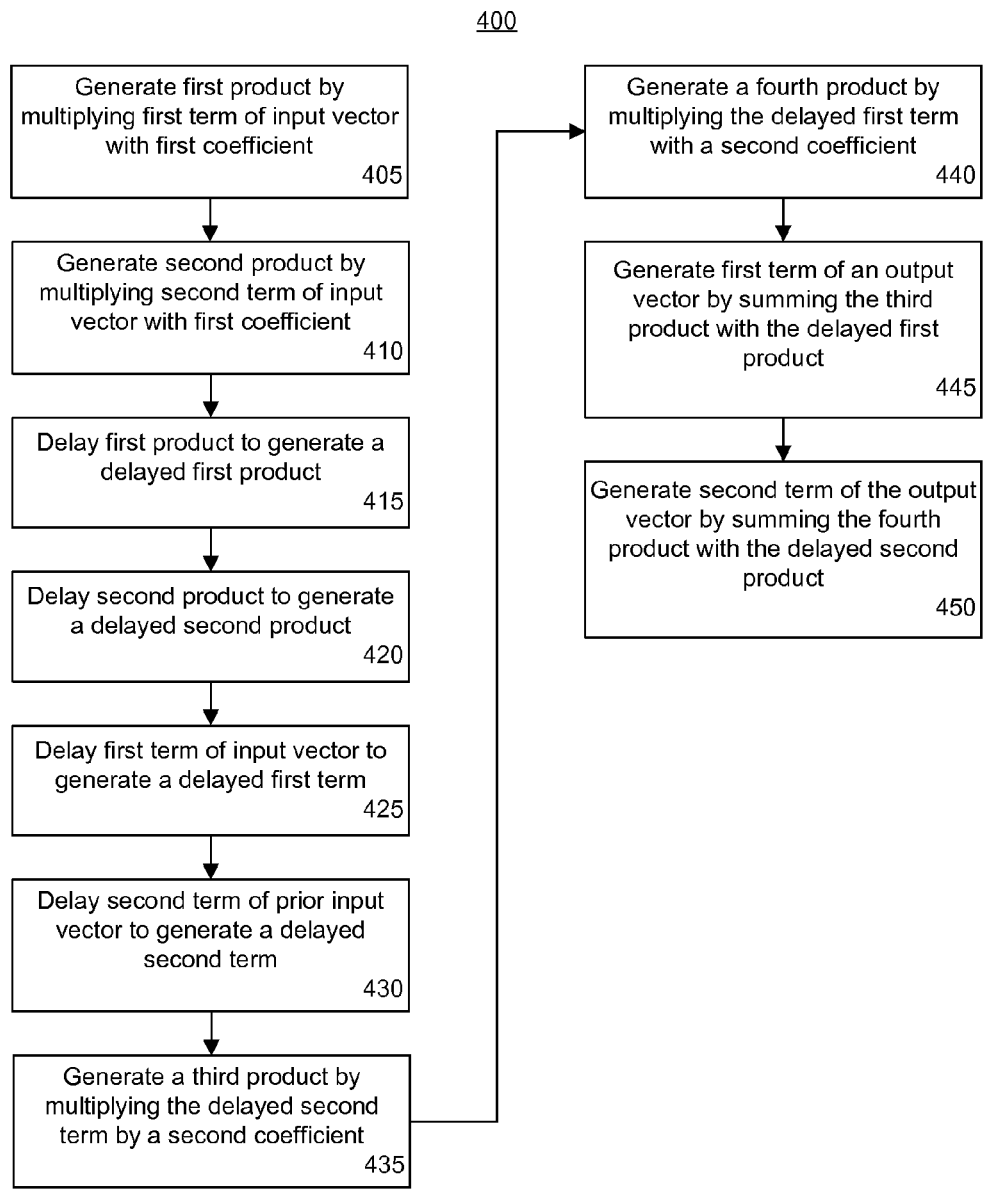
FIG. 4 is a flow chart illustrating a method of filtering a data stream in accordance with another embodiment disclosed within this specification.

FIG. 4 is a flow chart illustrating a method 400 of filtering a data stream in accordance with another embodiment disclosed within this specification. FIG. 4 illustrates an example of a method that can be performed using filter 125 as described with reference to FIG. 2. It should be appreciated, however, that the steps described can be adapted to different filter configurations that utilize the architecture illustrated in FIG. 2. For example, method 400 can be adapted to filters that have more than two stages or to filters that have wider inputs capable of receiving vectors that have more than two terms. In any case, method 400 can begin in a state where the data stream to be processed has been converted to one or more vectors, with each vector including two terms.

Accordingly, in step 405, a first product can be generated by multiplying a first term of the input vector with a first coefficient of the filter. The first product can be generated, for example, by multiplier 205 of stage 1 of processing channel 130. In step 410, a second product can be generated by multiplying a second term of the input vector with the first coefficient of the filter. The second product can be generated, for example, by multiplier 230 of stage 1 of processing channel 135.

In step 415, the first product can be delayed to generate a delayed first product. Step 415 can be performed, for example, by delay 225 of stage 2 of processing channel 130. In step 420, the second product can be delayed to generate a delayed second product. Step 420, for example, can be performed by delay 250 of stage 2 of processing channel 135.

In step 425, the first term of the input vector can be delayed to generate a delayed first term. For example, the first term can be delayed by delay 235 of stage 2 of processing channel 135. In step 430, a second term of a prior input vector can be delayed to generate a delayed second term. The second term, for example, can be delayed by delay 210 of stage 2 of processing channel 130.

In step 435, a third product can be generated by multiplying the delayed second term by a second coefficient of the filter. The third product, for example, can be generated by multiplier 215 of stage 2 of processing channel 130. In step 440, a fourth product can be generated by multiplying the delayed first term by the second coefficient of the filter. For example, the fourth product can be generated by multiplier 240 of stage 2 of processing channel 135.

In step 445, a first term of an output vector of the filter can be generated. The first term of the output vector can be generated by summing the third product with the delayed first product. For example, the first term of the output vector can be generated by adder 220 of stage 2 of processing channel 130. In step 450, a second term of the output vector can be generated. The second term of the output vector can be generated by summing the fourth product with the delayed second product. The second term of the output vector, for example, can be generated by adder 245 of stage 2 of processing channel 135.

The one or more embodiments disclosed within this specification provide parallel filter implementations that can operate at data rates below that of the data stream being processed. The parallel filter architectures can include multi-port inputs and multi-port outputs that each operate at a same and equivalent data rate. Filter resources, e.g., those resources or circuit blocks that implement the multiply-accumulate processes, that operate at processing speeds below the sampled data sampling speed can perform the required processing tasks by allocating additional resources to parallel paths that collectively perform the required processing at the desired input-output sample rate.

The one or more embodiments also can be applied to multi-processing node devices and systems. For example, in cases where hyper-threading is utilized, level 2 and level 3 cache memories within a modern processor can be used to pass delayed samples along a memory-mapped "diagonal" in that delayed samples can be processed in the manner illustrated with reference to FIGS. 2 and 3. Accordingly, the one or more filter embodiments can be implemented within a processor. High speed memory resources can be used to perform memory mapping that exchanges data samples to implement the operations performed by the processing channels described within this specification. In this regard, the processor can utilize the high speed memories, e.g., caches, included therein to implement the various processing channels and circuit blocks described within this specification through execution of program code that realizes the steps and functions described.

It should be appreciated that the particular number of coefficients of the filter implemented (e.g., the number of stages) and the number of processing channels corresponding to the number of terms of the input and output vectors can be scaled as desired. In this regard, the particular number of stages and width of the input and output vectors used within this specification are for purposes of illustration only and are not intended as limitations. Further, as noted, the number of stages in each processing channel is correlated with, or matches, the number of coefficients of the filter being implemented.

The flowcharts in the figures illustrate the architecture, functionality, and operation of possible implementations of systems, methods, and computer program products according to one or more embodiments disclosed within this specification. In this regard, each block in the flowcharts can represent a module, segment, or portion of code, which includes one or more portions of executable program code that implements the specified logical function(s). Each block of the flow charts and the block diagrams further can represent one or more circuit blocks. Each circuit block, for example, can be implemented using one or more discrete circuit elements or can be implemented within an integrated circuit, e.g., circuit elements implemented within a semiconductor.

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system comprising memory and a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of processing a data stream using a filter, the method comprising:
generating a first product and a second product by multiplying each of a first term and a second term of an input vector respectively by a first coefficient of the filter using a first multiplier circuit and a second multiplier circuit of the filter;
delaying the first product and the second product to generate a delayed first product and a delayed second product;
delaying each of the first term and a second term of a prior input vector to generate a delayed first term and a delayed second term of the prior input vector;
generating a third product as the delayed second term of the prior input vector multiplied by a second coefficient of the filter using a third multiplier circuit of the filter, and generating a fourth product as the delayed first term of the input vector multiplied by the second coefficient of the filter using a fourth multiplier circuit of the filter; and
generating, using the filter, an output vector comprising a first output term as a sum of the third product and the delayed first product and a second output term as a sum of the fourth product and the delayed second product.

2. The method of claim 1, further comprising:
generating the input vector from a received data stream;
wherein a number of terms of the input vector corresponds to a number of coefficients used in the filter and a number of processing channel circuits of the filter.

3. The method of claim 2, further comprising:
performing each element of claim 1 at a data rate that is less than a data rate of the data stream.

4. The method of claim 3, further comprising:
performing each element of claim 1 at approximately a same data rate.

5. The method of claim 1, further comprising:
setting a width of the input vector and a width of the output vector to an integer value derived from a data rate of the data stream divided by an operational frequency of the first multiplier,
wherein the operational frequency of the first multiplier is less than the data rate of the input stream.

6. A filter, comprising:
a first processing channel circuit for processing a first term of an input vector using a first coefficient of the filter and a second term of a prior input vector using a second coefficient of the filter and generating a first term of an output vector;
wherein the first processing channel circuit comprises a first multiplier circuit configured to generate a first product of the first term of the input vector and the first coefficient, and a second multiplier circuit configured to generate a second product of a delay of the second term of the prior input vector and the second coefficient, and a first adder circuit configured to add a delay of the first product and the second product to generate the first term of the output vector; and
a second processing channel circuit for processing the second term of the input vector using the first coefficient of the filter and the first term of the input vector using the second coefficient of the filter, and generating a second term of the output vector;
wherein the second processing channel circuit comprises a third multiplier circuit configured to generate a third product of the second term of the input vector and the first coefficient, and a fourth multiplier circuit configured to generate a fourth product of a delay of the first term of the input vector and the second coefficient, and a second adder circuit configured to add a delay of the third product and the fourth product to generate the second term of the output vector.

7. The filter of claim 6, wherein a number of terms of the input vector corresponds to the number of coefficients used in the filter and the number of processing channels circuits of the filter.

8. The filter of claim 6, wherein the input vector is generated from a data stream and the first processing channel circuit and the second processing channel circuit operate at a data rate that is less than a data rate of the data stream.

* * * * *